United States Patent
Kim et al.

(10) Patent No.: US 7,304,371 B2
(45) Date of Patent: Dec. 4, 2007

(54) LEAD FRAME HAVING A LEAD WITH A NON-UNIFORM WIDTH

(75) Inventors: Tae-Hun Kim, Asan-si (KR); Jong-Bo Shim, Cheonan-si (KR); Tae-Je Cho, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/106,514

(22) Filed: Apr. 15, 2005

(65) Prior Publication Data

US 2006/0091506 A1     May 4, 2006

(30) Foreign Application Priority Data

Nov. 4, 2004    (KR)   ................... 10-2004-0089175

(51) Int. Cl.
*H01L 23/495*    (2006.01)

(52) U.S. Cl. ............... 257/674; 257/671; 257/672; 257/676; 257/E23.034; 257/E23.043; 257/E23.049

(58) Field of Classification Search ........ 257/E23.031, 257/E23.043, 671, 672, 674, 676, E23.034, 257/E23.049
See application file for complete search history.

(56) References Cited

U.S. PATENT DOCUMENTS 5,386,625 A * 2/1995 Tsukamoto ............. 29/835
5,988,707 A * 11/1999 Abe et al. ............. 257/666
6,037,652 A * 3/2000 Matsutomo ............. 257/666
6,448,633 B1 * 9/2002 Yee et al. ............. 257/666
6,797,540 B1 * 9/2004 Li et al. ............... 438/111
6,956,282 B1 * 10/2005 Alvarez et al. .......... 257/666
7,064,419 B1 * 6/2006 Bayan et al. ........... 257/666
2002/0121670 A1 * 9/2002 Minamio et al. ........ 257/459
2004/0145043 A1 * 7/2004 Hayashi et al. ......... 257/696
2006/0006523 A1 * 1/2006 Coyle et al. ........... 257/704

FOREIGN PATENT DOCUMENTS

JP    09-148520    6/1997
JP    10-163410    6/1998

* cited by examiner

*Primary Examiner*—Evan Pert
*Assistant Examiner*—Victor A. Mandala, Jr.
(74) *Attorney, Agent, or Firm*—Harness, Dickey & Pierce, P.L.C.

(57) ABSTRACT

A lead frame may include a plurality of leads, each having a bonding portion electrically connected to a semiconductor chip and an attaching portion. A tape may be provided on the attaching portions of the leads. The attaching portion of each lead may have a width that is smaller than the width of another portion of the lead. A plating layer may be provided on the attaching portion. The lead frame may be implemented in a semiconductor package.

14 Claims, 6 Drawing Sheets

US 7,304,371 B2

LEAD FRAME HAVING A LEAD WITH A NON-UNIFORM WIDTH

PRIORITY STATEMENT

This U.S. non-provisional application claims benefit of priority under 35 U.S.C. §119 of Korean Patent Application No. 2004-89175, filed on Nov. 4, 2004, the entire contents of which are incorporated herein by reference.

BACKGROUND OF THE INVENTION

1. Field of the Invention

Example, non-limiting embodiments of the present invention relate generally to a lead frame for a semiconductor package and, more particularly, to a lead frame on which a tape may be provided.

2. Description of the Related Art

It may be desirable to provide electronic products that are miniaturized and light weight. Such electronic products may incorporate semiconductor packages arranged in a high density layout. Accordingly, it may be desirable to provide semiconductor packages with components that that are miniaturized and light weight.

A semiconductor chip (which may be a component of a semiconductor package) may have a plurality of chip pads. The chip pads may be provided at fine pitch. The semiconductor chip may be mounted on a lead frame having leads that may be connected to the chip pads of the semiconductor chip. Accordingly, the leads may be provided at a fine pitch. The pitch (or spacing between corresponding points) of the leads may decrease (or become finer) as the number of leads increases.

A fine lead pitch may reduce intervals between leads. In some instances, an electrical short may occur due to a contact between leads. A tape may be provided on the leads in an effort to maintain the desired interval between adjacent leads. The tape may promote a stable bonding process (e.g., a wire bonding process) in which the leads may be electrically connected to the chip pads. The tape may also reduced likelihood of electrical shorts. The tape may be formed of insulating materials.

A conventional lead frame 10 having a tape 14 is depicted in FIGS. 1 through 3. The lead frame 10 may be fabricated from a Cu material. The lead frame may be implemented in a quad flat pack (QFP), for example. In general QFPs may have a rectangular (or square) shape, with leads provided on all four sides. The lead frame 10 may include a frame body 19, tie bars 11, a die pad 12, and a plurality of leads 17. The frame body 19 may have a square shape. The tie bars 11 may extend toward the die pad. The die pad 12 may have a square shape and be located at the center of the frame body 19. The die pad 12 may provide a location upon which a semiconductor chip may be mounted. The die pad 12 may be connected to the tie bars 11. The leads 17 may extend toward the die pad so that ends of the leads 17 may be arranged along the periphery of the die pad 12.

A tape 14 may be arranged on the frame body 19. The tape 14 may fix the tie bars 11 and leads 17 to the frame body. The tape 14 may include a film 14a fabricated from an insulating material and an insulating adhesive layer 14b provided on a surface of the film 14a.

A deformation of the lead 17 may result in a contact between adjacent leads 17, causing an electrical short. The tape 14 may maintain the position of the leads 17 with its adhesive strength, thereby reducing the likelihood of leads 17 becoming in contact with each other.

The leads 17 may include inner leads 13 extending toward the die pad 12. The leads 17 may also include outer leads 16 extending toward the frame body 19. Each inner leads 13 and a corresponding outer leads 16 may be of unitary, one-piece construction. A dam bar 15 may be provided on the frame body 19 and extend across the leads 17.

As shown in FIG. 2, each inner lead 13 may include a bonding portion 21 where a semiconductor chip may be electrically connected, and an attaching portion 22 where the tape may be provided. The bonding portion 21 and the attaching portion 22 may have the same width. An Ag plating layer 23 may be provided on the bonding portion 21.

Although conventional lead frames 10 are generally thought to provide acceptable performance, they are not without shortcomings. For example, a potential difference may occur between adjacent inner leads 13 of the lead frame 10. In this case, as shown in FIGS. 4 and 5, a dendrite 24 may be formed due to the movement of Cu ions across the tape 14. In some cases, the dendrite 24 may extend between adjacent leads and cause an electrical short between the leads 17.

For example, during a reliability test (such as a high temperature operating life test, for example) of a resultant semiconductor package after a sealing process using a molding compound 18, a potential difference may occur between adjacent inner leads 13. The electric field caused by the electrical potential difference may ionize Cu atoms contained in the inner leads 13. The ionization of Cu atoms may be generated in an attaching portion 22a of an anode (+) inner lead of the inner leads 13. Generally, the Cu ions of the anode (+) attaching portion 22a may diffuse and migrate along the tape 14 toward a cathode (−) attaching portion 22b of an adjacent inner lead 13 to create the dendrite 24. The dendrite 24 may grow to such an extent that it may come into contact with the attaching portion 22b, resulting in an electrical short between adjacent inner leads 13. FIG. 5 shows an electrical short that may occur between adjacent inner leads 13 due to a dendrite grown via the migration of Cu ions across the tape attaching portion.

SUMMARY OF THE INVENTION

According to an example, non-limiting embodiment of the present invention, a lead frame may include leads, each having a bonding portion electrically connected to a semiconductor chip, and an attaching portion. A tape may be may be provided on the attaching portions of the leads. The attaching portion of each lead may have a width that is smaller than the width of another portion of the lead. A plating layer may be provided on the attaching portions.

According to another example, non-limiting embodiment of the present invention, a lead frame may include a frame body, tie bars extending from the frame body, a die pad having a surface on which a semiconductor chip is mounted. A plurality of leads may extend from the frame body. Each lead may have an end arranged along the outer periphery of the die pad. A tape may be may be provided on respective attaching portions of the leads. The width of each lead at the attaching portion may be smaller than the width of another portion of the lead A plating layer may be provided on the attaching portions.

According to another example, non-limiting embodiment of the present invention, a lead of lead frame may include a bonding portion for electrically connecting to a semiconductor chip. The lead may also include an attaching portion for supporting a tape. The width of the attaching portion may be smaller than the width of the bonding portion.

According to another example, non-limiting embodiment of the present invention, a semiconductor package may include a lead frame having a lead. The lead may include a bonding portion and an attaching portion. A semiconductor ship may be provided on the lead frame and electrically connected to the bonding portion. A tape may be provided on the attaching portion. The attaching portion may have a width that is smaller than the width of the bonding portion

BRIEF DESCRIPTION OF THE DRAWINGS

Example, non-limiting embodiments of the present invention will be readily understood with reference to the following detailed description thereof provided in conjunction with the accompanying drawings, wherein like reference numerals designate like structural elements.

The drawings are provided for illustrative purposes only and are not drawn to scale. Rather, to improve clarity, the spatial relationships and relative sizing of the elements illustrated in the various embodiments may be reduced, expanded or rearranged.

DETAILED DESCRIPTION OF EXAMPLE, NON-LIMITING EMBODIMENTS

Example, non-limiting embodiments of the present invention will now be described with reference to the accompanying drawings and pointed out in the claims. It will be understood that the particular structure embodying the invention is shown by way of illustration only and not as a limitation of the invention. The invention may be embodied in many different forms and should not be construed as limited to the example embodiments set forth herein. Rather, the disclosed embodiments are provided so that this disclosure will be thorough and complete, and will convey the scope of the invention to those skilled in the art. The principles and features of the invention may be employed in varied and numerous embodiments without departing from the scope of the invention.

The figures are intended to illustrate the general characteristics of methods and devices of example, non-limiting embodiments of the invention Further, a layer is considered as being formed (or provided) "on" another layer or a substrate when formed (or provided) either directly on the referenced layer or the substrate or formed (or provided) on other layers or patterns overlaying the referenced layer.

Well-known structures, materials and processes are not described or illustrated in detail to avoid obscuring example, non-limiting embodiments of the present invention.

Figure 1:
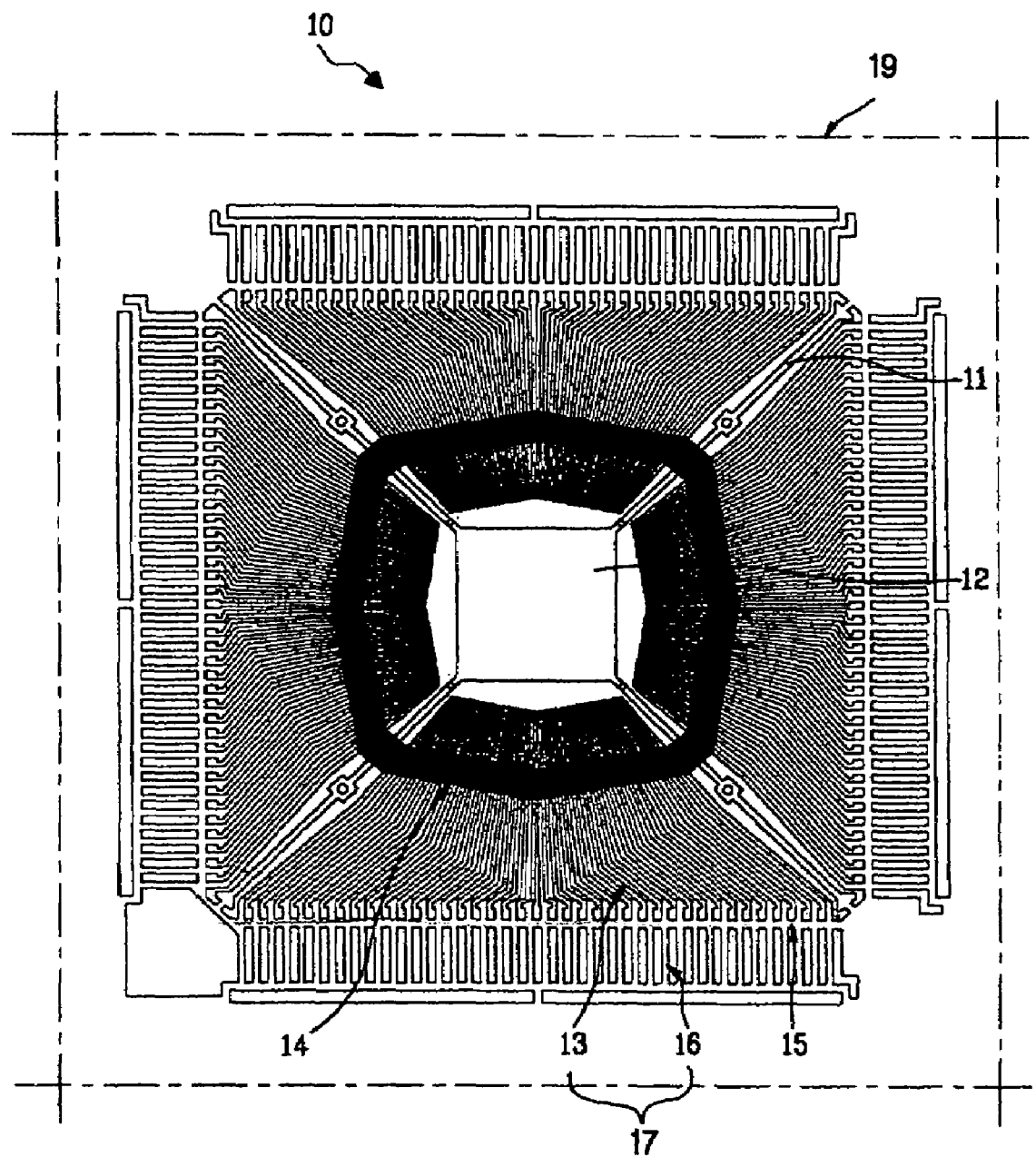
FIG. 1 is a plan view of a conventional lead frame having a tape.
Figure 2:
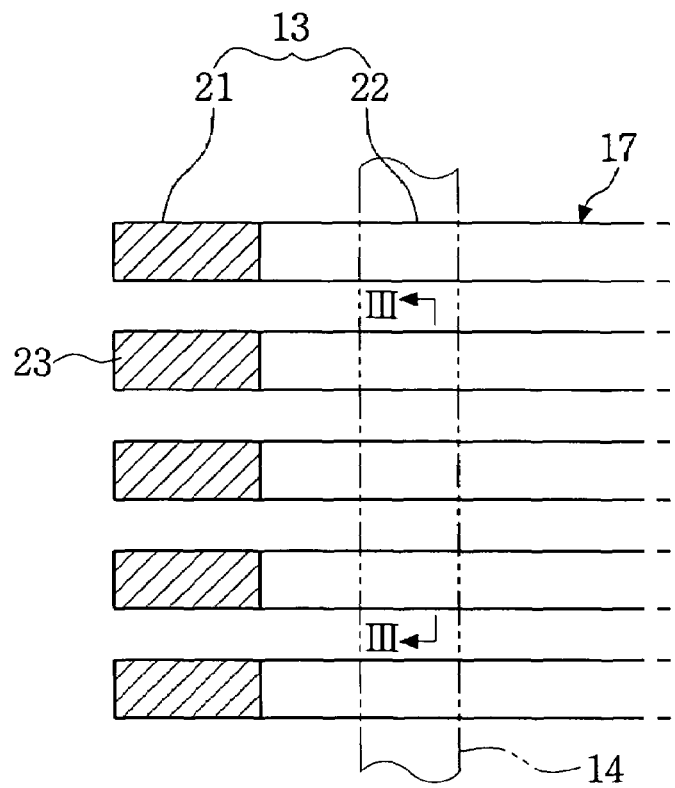
FIG. 2 is a plan view of a portion of the leads of the lead frame of FIG. 1.
Figure 3:
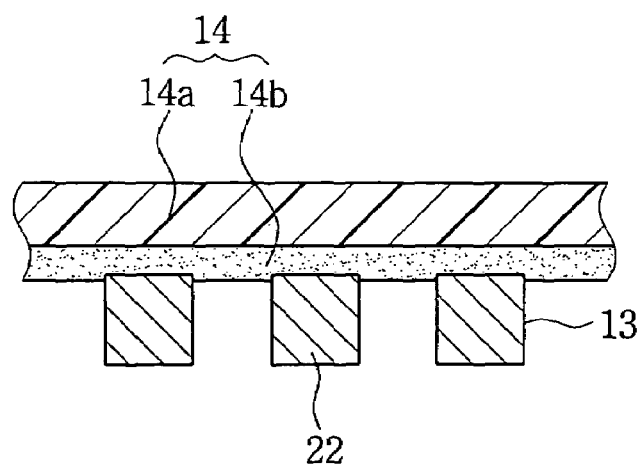
FIG. 3 is a cross-sectional view taken along the line III-III of FIG. 2.
Figure 4:
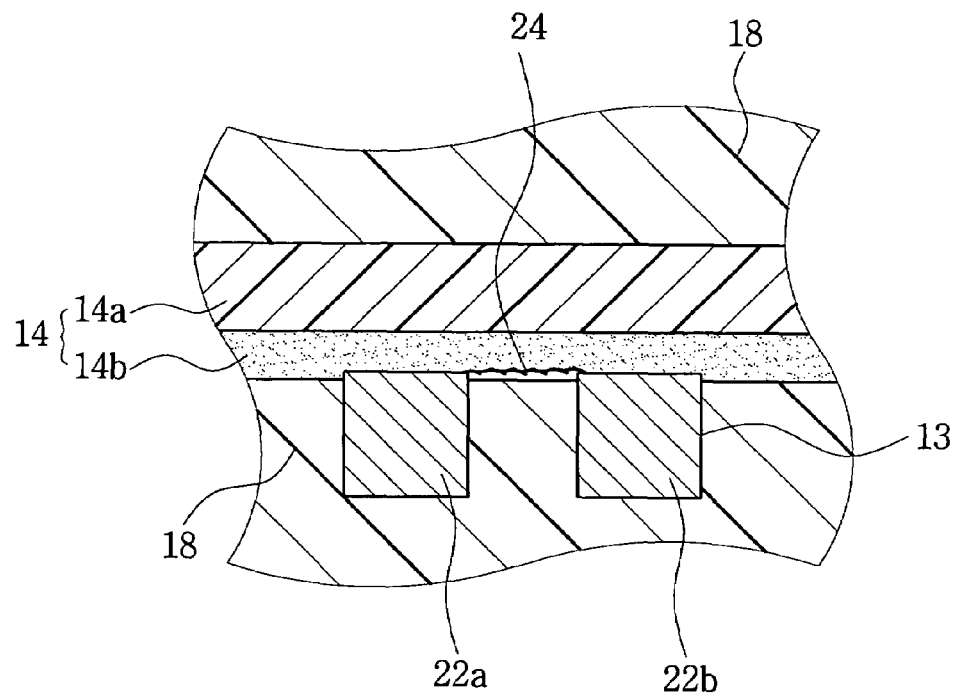
FIG. 4 is a cross-sectional view a dendrite that may cause an electrical short.
Figure 6:
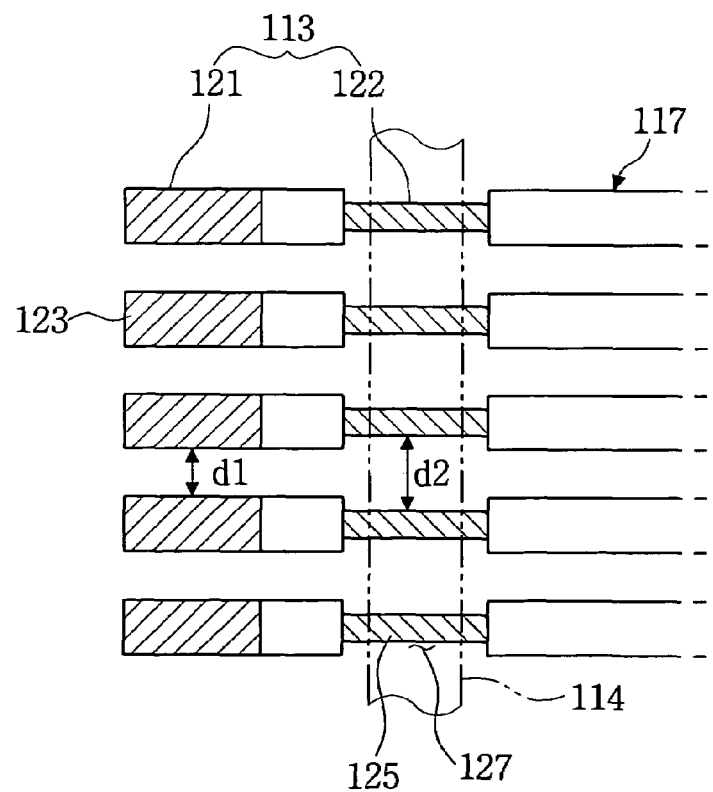
FIG. 6 is a plan view of a lead frame according to an example, non-limiting embodiment of the present invention.
Figure 5:
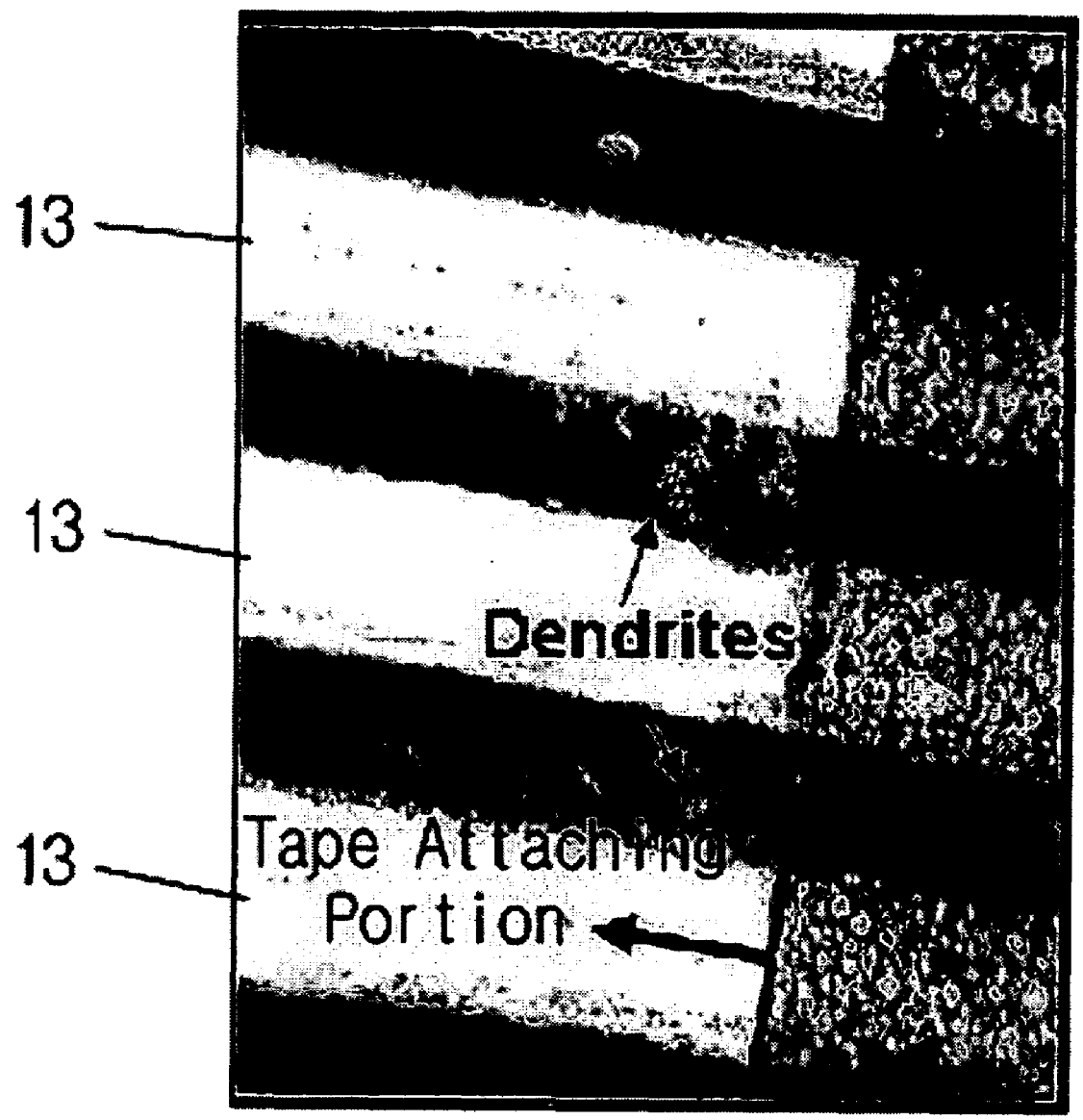
FIG. 5 is a plan view of a dendrite that may cause an electrical short.

FIG. 6 is a plan view of a lead frame having a tape 114 in accordance with an example, non-limiting embodiment of the present invention. FIG. 6 shows a portion of the lead frame; the portion of the lead frame not shown may have the same structure as the conventional lead frame shown in FIG. 1.

The lead frame may be fabricated from a Cu material. However, example embodiments of the invention are not limited in this regard as the numerous other alternative materials may be suitably implemented, as is well known in this art. With reference to FIG. 6, the lead frame may include leads 117 and a tape 114 (shown in phantom). The leads 117 may include inner leads 113. Each inner leads 113 may have a bonding portion 121 and an attaching portion 122. The bonding portion 121 may provide a site where a semiconductor chip may be electrically connected. By way of example only, and not as a limitation of the invention, the attaching portion 122 and the bonding portion 121 of each inner lead 113 may be of a unitary, one-piece construction. The tape 114 may be provided on the attaching portion 122 of the inner leads 113. The tape may be fabricated from materials that are well known in this art, and therefore a detail description of the same is omitted.

The bonding portion 121 may be provided at the end of the inner lead 113. A plating layer 123 may be formed on the surface of the bonding portion 121. The plating layer 123 may facilitate a stable bond process (e.g., a wire bonding process) in which the inner lead 113 is electrically connect to the semiconductor chip.

As shown in FIG. 6, the inner lead 113 may have a non-uniform width. For example, the width of the attaching portion 122 may be smaller than that of the bonding portion 121. Accordingly, a distance (d2) between the attaching portions 122 of adjacent inner leads 113 may be larger than a distance (d1) between the bonding portion 121. In this example embodiment, the attaching portion 122 may also have a smaller width than portions of the outer lead extending inward and toward the attaching portion 122. The relatively large distance (d2) may increase the route of a dendrite that may occur at the attaching portion 122, thereby reducing the likelihood of an electrical short that may occur between adjacent inner leads 113 due to the dendrite.

The attaching portion 122 may be reduced in width by forming a groove 127 in the lead 17. The length of the attaching portion 122 may be larger than the width of the tape 114.

A plating layer 125 may be provided on the attaching portion 122. The plating layer 125 may inhibit the migration of Cu ions, thereby reducing the likelihood of an electrical short between adjacent inner leads 113 that may be caused by a dendrite. The plating layer 125 may be fabricated from Ni or Pd, but the plating material may be not limited in this regard.

The tape 114 may extend perpendicular to the attaching portion 122. The tape 114 of this example, non-limiting embodiment may be formed in a linear shape, similar to the conventional tape. In this example embodiment, all of the inner leads may have the same shape, but the invention is not limited in this regard. For example, some attaching portions may have a uniform widths (as shown) and others may have a varied widths (e.g., tapered shapes, curved shapes, wavy shapes, etc.).

In this example, non-limiting embodiment, the tape 114 may have a linear shape, but the invention is not limited in this regard. For example, the tape 114 may have a zigzag shape shown in FIGS. 7A and 7B.

Figure 7A:
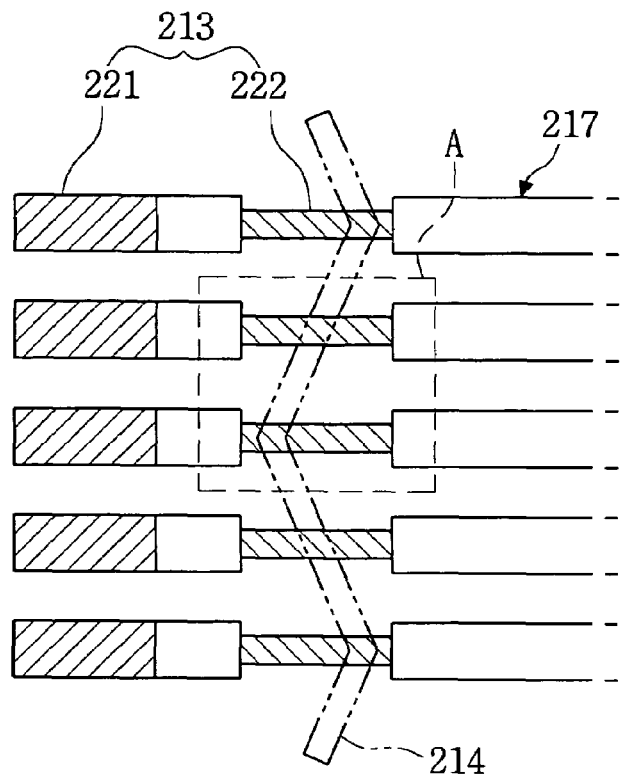
FIG. 7A is a plan view of a lead frame according to another example, non-limiting embodiment of the present invention.
Figure 7B:
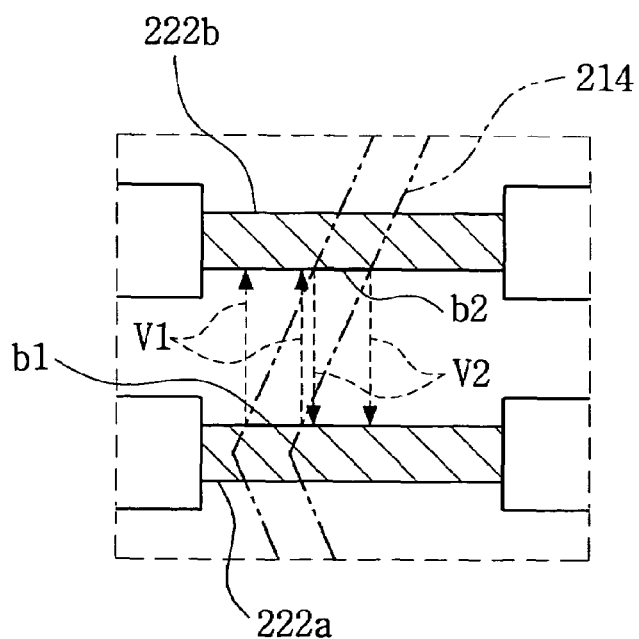
FIG. 7B is an enlarged view of section A of FIG. 7A.

Referring to FIGS. 7A and 7B, the tape 214 may extend in a zigzag fashion so that the tape 214 may not trace a shortest distance between adjacent attaching portions 222a and 222b. In this way, the tape 214 may reduce (or altogether avoid) an overlap of a first area between the lines V1 and a second area between the lines V2. Here, the lines V1 represent a shortest distance from the position of the tape 214 at boundary b1 of the attaching portion 222a to the position of the tape 214 at a boundary b2 of the attaching portion 222b. The lines V2 represent a shortest distance from the position of the tape 214 at the boundary b2 to the position of the tape 214 at the boundary b1. It is preferable to use a zigzag tape 214 in which an area between the lines V1 and an area between the lines V2 may not overlap, as shown in FIGS. 7A and 7B.

The zigzag tape 214 may reduce the overlap portion of an area between the lines V1 and an area between the lines V2, thereby lengthening the route of Cu ions and reducing the likelihood of an electrical short between adjacent inner leads, caused by a dendrite. It will be appreciated that numerous modifications of the tape 214 may be suitably implemented. For example, instead of being zigzag shaped, the tape may have any serpentine shape that does not trace the shortest distance between adjacent attaching portions 222a and 222b. Moreover, the portions of the tape extending between adjacent attaching portions 222a and 222b may be curved (instead of being linear as shown in FIGS. 7A and 7B).

Figure 8:
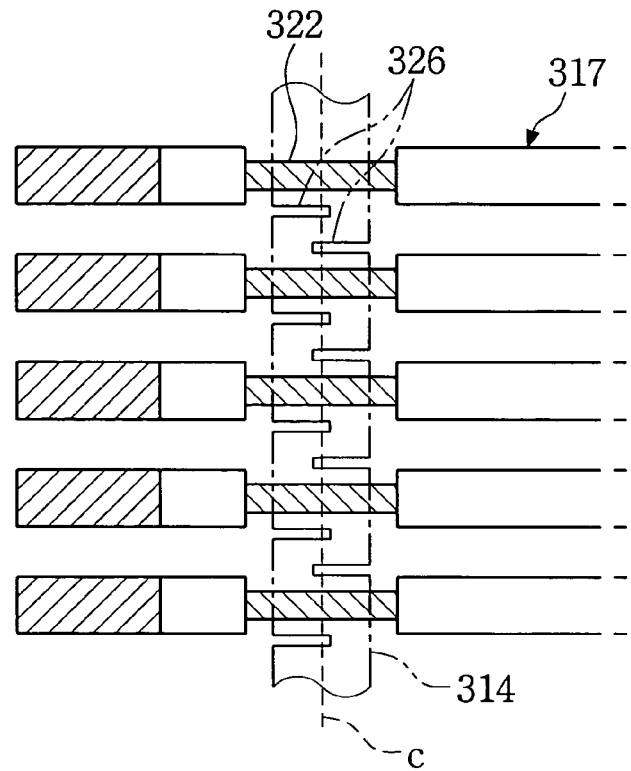
FIG. 8 is a plan view of a lead frame according to another example, non-limiting embodiment of the present invention.
Figure 9:
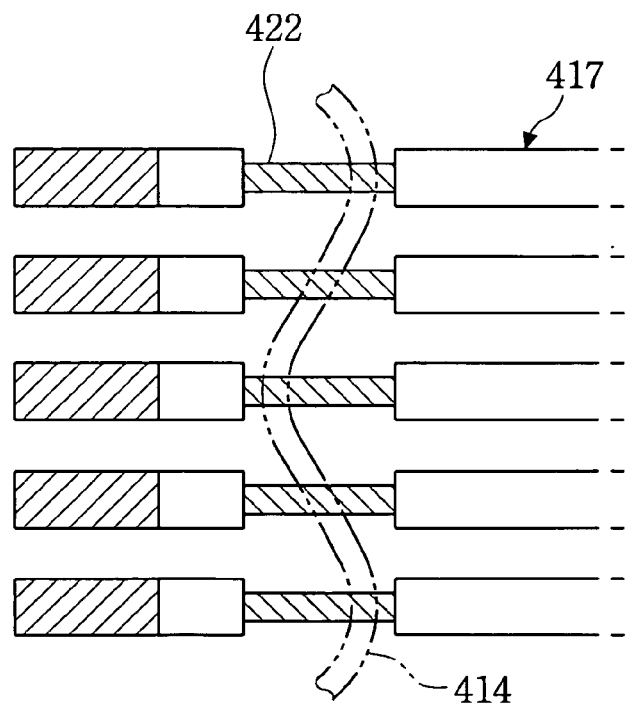
FIG. 9 is a plan view of a lead frame according to another example, non-limiting embodiment of the present invention.

In other example, non-embodiments of the invention, the tape may have slits 326 (as shown in FIG. 8) and/or have a wavy shape (as shown in FIG. 9), for example.

Referring to FIG. 8, a tape 314 may have slits 326 formed along opposite sides thereof. By way of example only, and not as a limitation of the invention, a pair of slits 326 may be arranged at opposite sides of the tape 314 between adjacent attaching portions 322. It will be appreciated that the invention is not limited to any particular number of slits being provided between adjacent attaching portions 322. The ends of the slits 326 may extend to the center line (c) of the tape 314. The length of the slit 326 may be equal to or larger than half of the width of the tape 314. In this example, non-limiting embodiment, the slits 326 may have a rectangular profile, but the invention is not limited in this regard as slits having any geometric shape may be suitably implemented. Moreover, a given tape may be provided with slits having different shapes.

Referring to FIG. 9, a serpentine tape 414 may be provided on an attaching portion 422.

In accordance with the example, non-limiting embodiments of the present invention, the width of the lead at the attaching portion may be smaller than that of the lead at other portions. The distance between the attaching portions of adjacent inner leads may be larger than the distance between the other portions of adjacent inner leads. This may increase the route of a dendrite that may occur at the attaching portion, thereby reducing the likelihood of an electrical short between the inner leads, caused by the dendrite The plating layer may be provided on the attaching portion to inhibit the migration of Cu ions, thereby reducing the likelihood of an electrical short.

The tape may be shaped such that it may not trace the shortest distance between the attaching portions of adjacent inner leads. Therefore, the tape may lengthen the potential migration path of Cu ions, thereby reducing the likelihood of an electrical short between the inner leads, caused by a dendrite.

Although the disclosed example embodiments are implemented in a lead frame for a QFP, the invention is not limited in this regard. For example, the inventive concepts may be suitably applied to a lead frame for a thin quad flat pack (TQFP), a plastic quad flat pack (PQFP), or a shrink quad flat pack (SQFP), which are well known packaging techniques in surface mount technologies. The inventive concepts may also be applied to a lead frame for a lead on chip. Further, features of the various embodiments may be suitably implemented in a single application. For example, a given tape may extend in a zigzag (or some other serpentine fashion) and additionally include slits.

Although example, non-limiting embodiments of the present invention have been described in detail hereinabove, it will be understood that many variations and/or modifications of the basic inventive concepts, which may appear to those skilled in the art, will fall within the spirit and scope of the present invention, as defined in the appended claims.

What is claimed is:

1. A lead frame comprising:
    a plurality of leads,
    each lead having a bonding portion electrically connected to a semiconductor chip and a tape attaching portion, and
    the tape attaching portion of each lead having a width that is smaller than a width of another portion of the lead;
    a tape provided on the tape attaching portions of the leads; and the
    a plating layer provided on the tape attaching portions,
    wherein a distance between tape attaching portions of adjacent leads is larger than a distance between bonding portions of the adjacent leads.

2. The lead frame of claim 1, wherein the tape attaching portions are reduced in width by forming grooves in the leads.

3. The lead frame of claim 2, wherein the length of the tape attaching portion is larger than the width of the fixing tape.

4. The lead frame of claim 3, wherein the plating layer is formed on at least one surface of each of the tape attaching portions.

5. The lead frame of claim 4, wherein the plating layer is fabricated from at least one of Ni and Pd.

6. The lead frame of claim 1, wherein the tape extends in a serpentine fashion across the tape attaching portions.

7. The lead frame of claim 1, wherein the tape attaching portion and the bonding portion of each lead are of an integral, one-piece construction.

8. The lead frame of claim 1, wherein the bonding portions are wire bonded to the semiconductor chip.

9. A semiconductor package comprising the lead frame of claim 1.

10. A lead frame comprising:
    a frame body;
    tie bars extending from the frame body;
    a die pad having a surface on which a semiconductor chip is mounted, the die pad being connected to the tie bars;
    a plurality of leads,
    each lead extending from the frame body and having an end arranged along the outer periphery of the die pad, and
    a width of each lead at the tape attaching portion being smaller than a width of another portion of the lead;

a tape provided on respective tape attaching portions of the leads; and a plating layer provided on the tape attaching portions, wherein a distance between tape attaching portions of adjacent leads is larger than a distance between bonding portions of the adjacent leads.

11. The lead frame of claim 10, wherein each of the leads includes an inner lead having a bonding portion electrically connected to the semiconductor chip, and an outer lead extending toward the frame body; and wherein the width of each lead at the tape attaching portion is smaller than the width of the lead at the bonding portion.

12. The lead frame of claim 11, wherein the tape attaching portion and the bonding portion of each lead are of an integral, one-piece construction.

13. The lead frame of claim 10, wherein the leads are wire bonded to the semiconductor chip.

14. A semiconductor package comprising:

a lead frame having a lead, the lead including a bonding portion and a tape attaching portion, and the tape attaching portion having a width that is smaller than a width of the bonding portion;

a semiconductor chip provided on the lead frame and electrically connected to the bonding portion; and a tape provided on the tape attaching portion, wherein a distance between tape attaching portions of adjacent leads is larger than a distance between bonding portions of the adjacent leads.

* * * * *